United States Patent
Skinner

(10) Patent No.: US 7,312,970 B2
(45) Date of Patent: Dec. 25, 2007

(54) LOW COST SURGE PROTECTION

(75) Inventor: James L Skinner, St. Ann, MO (US)

(73) Assignee: Emerson Electric Co., St. Louis, MO (US)

( * ) Notice: Subject to any disclaimer, the term of this patent is extended or adjusted under 35 U.S.C. 154(b) by 350 days.

(21) Appl. No.: 10/754,739

(22) Filed: Jan. 9, 2004

(65) Prior Publication Data

US 2005/0152085 A1 Jul. 14, 2005

(51) Int. Cl.
*H02H 9/06* (2006.01)
*H02H 1/00* (2006.01)

(52) U.S. Cl. .......... 361/111; 361/120; 361/127

(58) Field of Classification Search ........ 361/23, 361/111–128, 56, 93.1, 93.5, 93.6, 93.7, 104; 324/511, 522
See application file for complete search history.

(56) References Cited

U.S. PATENT DOCUMENTS

| | | | | |
|---|---|---|---|---|
| 4,023,071 A * | 5/1977 | Fussell | .......... | 361/56 |
| 4,340,853 A | 7/1982 | Braun et al. | | |
| 5,319,533 A * | 6/1994 | Reynolds et al. | .......... | 363/17 |
| 5,321,575 A * | 6/1994 | Shilo | .......... | 361/56 |
| 5,555,150 A * | 9/1996 | Newman, Jr. | .......... | 361/56 |
| 5,606,232 A * | 2/1997 | Harlan et al. | .......... | 318/138 |
| 5,619,105 A * | 4/1997 | Holmquest | .......... | 315/225 |
| 6,496,015 B2 * | 12/2002 | Stanford et al. | .......... | 324/541 |
| 2002/0163820 A1 * | 11/2002 | Nakamura | .......... | 363/56.03 |
| 2003/0086225 A1 * | 5/2003 | Chaudhry et al. | .......... | 361/91.1 |
| 2004/0169970 A1 * | 9/2004 | Deines et al. | .......... | 361/42 |
| 2005/0083628 A1 * | 4/2005 | Holzenthal, Jr. | .......... | 361/118 |

FOREIGN PATENT DOCUMENTS

| | | |
|---|---|---|
| DE | 19523292 | 11/1996 |
| GB | 2175156 | 11/1986 |

* cited by examiner

*Primary Examiner*—Michael Sherry
*Assistant Examiner*—Danny Nguyen
(74) *Attorney, Agent, or Firm*—Harness, Dickey & Pierce, P.L.C.

(57) ABSTRACT

A motor drive for an electric machine includes a live line, a second line, and a ground line. A surge protector includes a first varistor and a gas discharge tube (GDT) that is non-conductive below a trigger voltage and that is conductive above the trigger voltage. The first varistor and the GDT are connected in series between one of the live line and the second line and the second line and the ground line. A second varistor is connected between the other of the live line and the second line and the second line and the ground line. When a voltage on the live line exceeds the trigger voltage, the first varistor, the second varistor and the GDT limit voltage output to the electric machine and deliver excess voltage to the ground line.

32 Claims, 2 Drawing Sheets

LOW COST SURGE PROTECTION

FIELD OF THE INVENTION

The present invention relates to appliance motor drives, and more particularly to an appliance motor drive incorporating low cost surge protection.

BACKGROUND OF THE INVENTION

Appliances, such as dishwashers, washing machines, clothes dryers, and the like are typically driven by electric machines. A motor drive provides power from a source, such as a household power outlet, to the electric machine. The household power outlet typically supplies A/C power at a line voltage (such as 115V) and a line frequency (such as 60 Hz).

Line voltage transients, or surges, can occur due to lightning strikes and other sources. Voltage surges may reach up to 6000V. Residential electrical appliances are designed to withstand these power surges. Some motor drives incorporate surge protection circuits that limit damage due to power surges. One surge protection circuit includes a line to neutral metal oxide varistor (MOV) and a neutral to ground MOV in the motor drive circuitry. The MOV's clamp the surge voltages.

Appliances typically undergo insulation testing, which requires 1200V to 1800V to be applied to the electric machine through the motor drive. This high voltage causes conduction of traditional MOV-type surge protectors that are incorporated in the motor drive which prevents satisfactory testing. As a result, a jumper circuit is used during insulation testing to disconnect the surge protection circuit. The requirement of connecting and disconnecting the jumper circuit adds additional cost and time to the manufacturing process.

Another surge protection circuit employs spark gaps in the circuit board of the motor drive. The breakdown voltage of spark gaps, however, is adversely impacted by dirt and humidity variations. Spark gaps are further subject to carbon accumulation and metal displacement from electrodes into the spark gap area, which limits their useful life.

SUMMARY OF THE INVENTION

A motor drive for an electric machine according to the present invention includes a live line, a second line, and a ground line. A surge protector includes a first varistor and a gas discharge tube (GDT) that is non-conductive below a trigger voltage and that is conductive above the trigger voltage. The first varistor and the GDT are connected in series between one of the live line and the second line and the second line and the ground line.

In other features, the first varistor has a voltage threshold that is less than a hi-pot test voltage and the trigger voltage. The hi-pot test voltage is less than the trigger voltage. The trigger voltage is less than a surge voltage.

In yet other features, the surge protector further comprises a second varistor connected between the other of the live line and the second line and the second line and the ground line. When a voltage on the live line exceeds the trigger voltage, the first varistor, the second varistor and the GDT function to limit the voltages.

In still other features, the surge protector further includes a fuse that is connected in series with the live line and that creates an open-circuit when current flowing through the fuse exceeds a current threshold of the fuse.

In still other features, a rectifier communicates with the live line, the second line and the ground line and converts an AC power input to a DC power output. A first capacitor has one end that communicates with a first output of the rectifier and an opposite end that communicates with the second line. A second capacitor has one end that communicates with a second output of the rectifier and an opposite end that communicates with the second line. A first resistor is connected in parallel to the first capacitor. A second resistor is connected in parallel to the second capacitor.

In still other features, the first and second varistors are metal oxide varistors (MOVs).

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
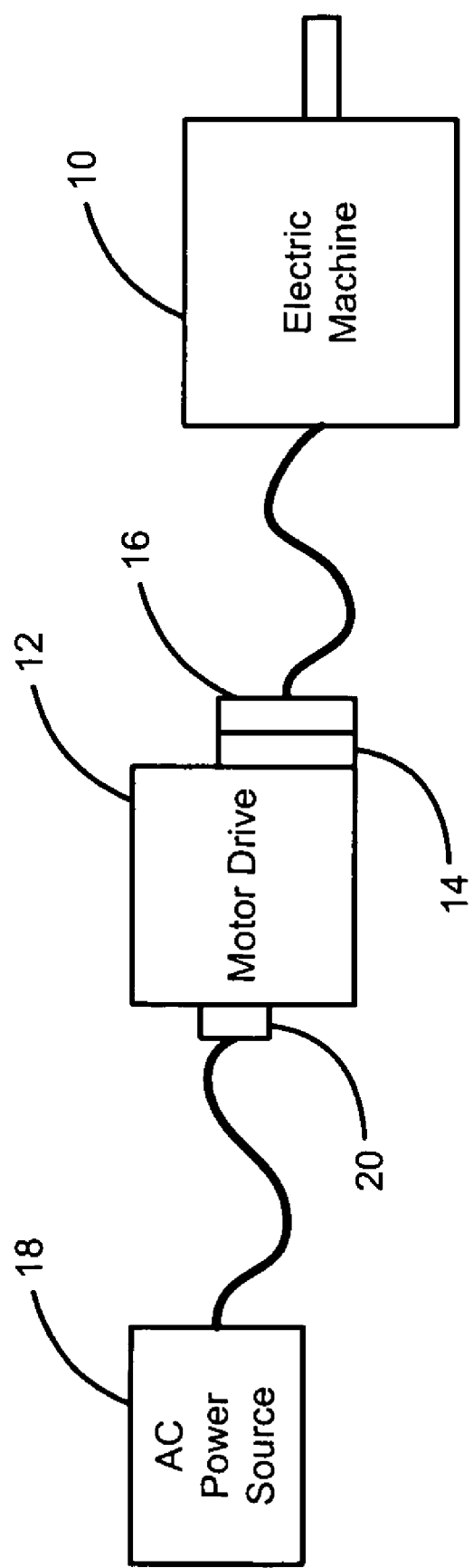
FIG. 1 illustrates an electric machine that receives power from a motor drive.

The following description of the preferred embodiments is merely exemplary in nature and is in no way intended to limit the invention, its application, or uses. For purposes of clarity, the same reference numbers will be used in the drawings to identify similar elements.

Referring now to FIG. 1, an electric machine 10 is schematically illustrated. In one embodiment, the electric machine 10 is a direct-current (DC) or alternating-current (AC), fractional horsepower (Hp) electric machine. The electric machine 10 is powered by a voltage signal (AC or DC) and generates power under 1 Hp. While a fractional Hp electric machine is shown and described, other types of electric machines may be used. The voltage signal to the electric machine 10 is supplied by a motor drive 12. A motor drive connector 14 that is associated with the motor drive 12 is connected to an electric machine connector 16 that is associated with the electric machine 10. An alternating-current (AC) power source 18 provides an AC voltage signal to the motor drive 12 through a power input 20. The motor drive 12 converts the AC voltage signal to a DC voltage signal to power the electric machine 10, in the case of a DC electric machine.

Figure 2:
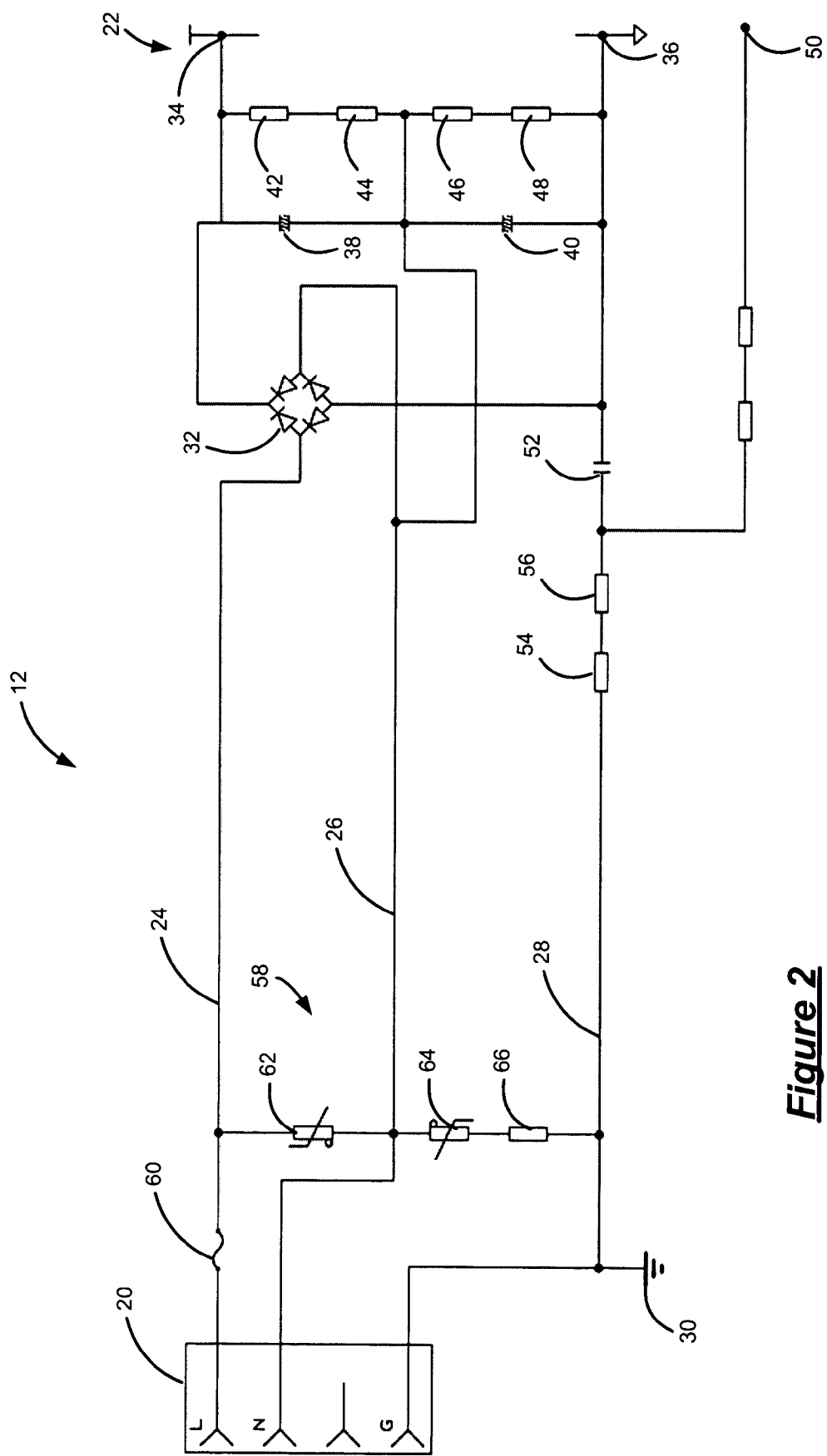
FIG. 2 is an electrical schematic of the motor drive according to the principles of the present invention.

Referring now to FIG. 2, an electrical schematic of the motor drive 12 is illustrated. The motor drive 12 includes the power input 20 and a power output or voltage bus 22. The power input 20 includes a live line 24, a second line 26 and a ground line 28. In the case of a 115V application, the second line 26 is a neutral line. In the case of a 230V application, the second line 26 is a second live line. Power is supplied to the voltage bus 22 via the live and second lines 24 and 26. The ground line 28 is connected to a safety ground 30. A voltage rectifier 32 converts the AC voltage signal from the power input 20 to the DC voltage signal. In some applications, the voltage rectifier 32 can be a doubler-type voltage rectifier or a standard full wave-type voltage rectifier.

The DC voltage signal is supplied to the voltage bus 22. The voltage bus 22 includes a voltage output terminal 34 and a common return terminal 36. The voltage bus 22 communicates with the motor drive connector 14 to supply the DC voltage signal to the electric machine 10 through the electric machine connector 16. Capacitors 38 and 40 store charge. Resistors 42, 44, 46 and 48 equalize stored charges in the capacitors 38 and 40. While four resistors are shown, additional or fewer resistors may be used.

A motor case terminal 50 is connected to a motor case (not shown) of the electric machine 10 through the connectors 14 and 16. A capacitor 52 enables voltage from the motor case to bypass the voltage bus 22 to the common return 36. In this manner, electro-magnetic interference (EMI) from the motor case is limited. Resistors 54 and 56 allow the motor case to float while enabling a DC path to ground 30. In this manner, charge is not built up in the motor case over time.

The motor drive 12 includes a surge protector 58 that prevents excessive voltage from damaging the components of the motor drive 12 and the electric machine 10. The surge protector 58 includes a fuse 60 in the live line 24 and a metal-oxide varistor (MOV) 62 that bridges the live and second lines 24 and 26. The surge protector 58 further includes MOV 64 and a gas-discharge tube (GDT) 66 that are connected in series and that bridge the second line and the ground line 26 and 28. The surge protector 58 enables insulation testing, discussed in further detail below, without modification to the motor drive 12, while protecting the motor drive 12 and electric machine 10 from voltage surges.

The MOV's 62 and 64 limit surge voltages by clamping them as will be described. The MOV's 62 and 64 provide a variable resistance that is based on the voltage across each. Each MOV 62 and 64 includes a corresponding voltage threshold or break-over voltage. Exemplary break-over voltages for the MOV's 62 and 64 are between approximately 600V and 800V. When the voltage across the MOV is less than its break-over voltage, the MOV has a high resistance that limits current flow. When the voltage across the MOV is above its break-over voltage, the MOV has a relatively low resistance that limits the voltage.

The GDT 66 also limits voltage. The GDT 66 includes an inert gas within a ceramic housing that is capped by electrodes (not shown). The GDT 66 has a trigger voltage, above which it becomes conductive. An exemplary trigger voltage is between 3000V and 3500V. For example, when the voltage across the GDT 66 is below the trigger voltage, the GDT 66 is non-conductive (i.e., no current flow therethrough). When the voltage across the GDT 66 is above the trigger voltage, the GDT 66 is conductive and current flows therethrough. Once the GDT 66 is triggered, it becomes highly conductive. This further limits the voltage and reduces the possibility of damage from the voltage surge.

The fuse 60 also provides surge protection. When the current exceeds the rated current of the fuse, the fuse blows and creates an open-circuit. The open-circuit prevents power flow through the motor drive 12 and prevents operation of the electric machine 10. If a normal, sustained voltage appears on the second line 26, the series MOV 64 allows the normal voltage without clamping.

When operating under a normal condition, the AC voltage signal from the power source 18 is supplied to the voltage rectifier 32 through the live and second lines 24 and 26. The voltage rectifier 32 converts the AC voltage signal to the DC voltage signal, which is supplied to the voltage bus 22. The DC signal from the voltage bus drives the electric machine 10 through the connectors 14 and 16.

Prior to entering the marketplace, the motor drive 12 may undergo insulation testing or high potential (hi-pot) testing to insure component integrity. Hi-pot testing generally requires applying an AC voltage signal to the power input 20 at approximately twice the line voltage plus 1000V. The line voltage can be 115V, or other voltage levels. In applications including a doubler-type voltage rectifier, the line voltage is typically 115V. Therefore, during hi-pot testing, 1230V (2*115V+1000V) to as much as 1460V (2*230V+1000V) can be supplied through the motor drive 12.

In one test, the hi-pot testing includes application of the amplified voltage through the motor drive 12 for a 60 second period. However, in hi-pot testing, the testing time can be reduced by increasing the applied voltage. More particularly, an increase of approximately 20% in the voltage reduces the testing time to approximately 1 second. Therefore, in the lightest case, 1230V is applied through the motor drive 12 (115V application using 60s test time). In the heaviest case, up to approximately 1800V is applied through the motor drive 12 (230V application using 1 s test time).

When hi-pot testing, the live and second lines 24 and 26 are interconnected by a jumper (not shown). An amplified AC voltage is applied between the combined live line 24 and second line 26 and ground 30. The amplified voltage ranges between approximately 1230V and 1800V depending on the application type and testing time, as discussed above. The amplified voltage signal is supplied to the voltage rectifier 32 through the combined live and second lines 24 and 26.

Neither the MOV 62 nor the series MOV 64 and GDT 66 affect the application of the amplified voltage during hi-pot testing. Because the live and second lines 24 and 26 are combined, opposite ends of the MOV 62 are at the same voltage potential and there is no voltage drop across the MOV 62. Therefore, the break-over voltage of the MOV 62 is not reached. Although the break-over voltage of the MOV 64 would be achieved during hi-pot testing, the trigger voltage of the GDT 66 is not achieved. Therefore, the GDT 66 remains non-conductive and there is no path to ground 30.

A voltage surge from the power source 18 induces operation of the motor drive 13 under a surge condition. A lightning strike or other event can induce a voltage surge up to approximately 6000V. Additionally, surges can occur in one of two modes, a common mode and a differential mode. In the common mode, the voltage surge is applied through the motor drive 12 via both the live and second lines 24 and 26 (i.e., live and second lines are combined). In the differential mode, the voltage surge is applied through the motor drive 12 via the live line 24, as would occur during normal operation.

During a common mode surge, the MOV 64 and the GDT 66 limit the voltage through the motor drive 12 and divert the excess voltage to ground 30. More particularly, as the voltage surges, the voltage across the MOV 64 exceeds the break-over voltage and the voltage across the GDT 66 exceeds the trigger voltage. As a result, the GDT 66 is conductive and diverts the excess voltage to ground 30. During a differential mode surge, the MOV 62 limits the voltage to the motor drive 12, clamping the excess voltage as previously described. More particularly, as the voltage surges, the voltage across the MOV 62 achieves its break-over voltage.

Although the present description and Figures illustrate the MOV 64 and the GDT 66 connected in series between the second line 26 and the ground line 28, it is anticipated that the MOV 64 and the GDT 66 can be connected in series between the live line 24 and the second line 26. With this configuration, the MOV 62 is connected across the second line 26 and the ground line 28. The surge protector 58 provides similar surge protection of the motor drive 12 in this alternative configuration.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A motor drive for an electric machine, comprising:
    a live line;
    a second line;
    a ground line;
    a rectifier that communicates with said live line, said second line and said ground line and that converts an AC power input to a DC power output;
    a first capacitor that is coupled between a first output of said rectifier and said second line;
    a second capacitor that is coupled between a second output of said rectifier and said second line; and
    a surge protector including:
        a first varistor; and
        a gas discharge tube (GDT) that is non-conductive below a trigger voltage and that is conductive above said trigger voltage,
        wherein said first varistor and said GDT are connected in series between one of said live line and said second line and said second line and said ground line.

2. The motor drive of claim 1 wherein the trigger voltage is greater than a hi-pot test voltage.

3. The motor drive of claim 1 wherein said first varistor has a voltage threshold that is less than a hi-pot test voltage and said trigger voltage, wherein said hi-pot test voltage is less than said trigger voltage, and wherein said trigger voltage is less than a surge voltage.

4. The motor drive of claim 1 wherein said surge protector further comprises a second varistor connected between the other of said live line and said second line and said second line and said ground line.

5. The motor drive of claim 4 wherein when a voltage on said live line exceeds said trigger voltage, said first varistor, said second varistor and said GDT clamp excess voltage between said live line and said second line and clamp excess voltage between said second line and said ground line.

6. The motor drive of claim 1 wherein said surge protector further includes a fuse that is connected in series with said live line and that creates an open-circuit when current flowing through said fuse exceeds a current threshold of said fuse.

7. The motor drive of claim 1 wherein said rectifier is a doubler-type rectifier.

8. The motor drive of claim 1 wherein said second line is a neutral line.

9. The motor drive of claim 1 wherein said second line is a second live line.

10. The motor drive of claim 1 further comprising:
    a first resistor that is connected in parallel to said first capacitor;
    a second resistor that is connected in parallel to said second capacitor.

11. The motor drive of claim 4 wherein said first and second varistors are metal oxide varistors (MOVs).

12. The motor drive of claim 1 wherein said hi-pot test voltage is equal to a twice a live line voltage plus 1000V.

13. The motor drive of claim 12 wherein said hi-pot test voltage is between greater than or equal to 1230V.

14. The motor drive of claim 12 wherein said hi-pot test voltage is less than or equal to 1460V.

15. A motor drive for an electric machine, comprising:
    a live line;
    a second line;
    a ground line;
    a rectifier that communicates with said live line, said second line and said ground line and that converts an AC power input to a DC power output;
    a first capacitor that is coupled between a first output of said rectifier and said second line;
    a second capacitor that is coupled between a second output of said rectifier and said second line; and
    a surge protector including:
        a first varistor;
        a gas discharge tube (GDT) that is non-conductive below a trigger voltage and that is conductive above said trigger voltage, wherein said first varistor and said GDT are connected in series between one of said live line and said second line and said second line and said ground line; and
        a second varistor connected between the other of said live line and said second line and said second line and said ground line.

16. The motor drive of claim 15 wherein the trigger voltage is greater than a hi-pot test voltage.

17. The motor drive of claim 15 wherein said first and second varistors have a voltage threshold that is less than a hi-pot test voltage and said trigger voltage, wherein said hi-pot test voltage is less than said trigger voltage, and wherein said trigger voltage is less than a surge voltage.

18. The motor drive of claim 15 wherein when a voltage on said live line exceeds said trigger voltage, said first varistor, said second varistor and said GDT clamps excess voltage between said live line and said second line and clamps excess voltage between said second line and said ground line.

19. The motor drive of claim 15 wherein said surge protector further includes a fuse that is connected in series with said live line and that creates an open-circuit when current flowing through said fuse exceeds a current threshold of said fuse.

20. The motor drive of claim 15 wherein said rectifier is a doubler-type rectifier.

21. The motor drive of claim 15 further comprising:
    a first resistance having one end that is connected in parallel to said first capacitor;
    a second resistance that is connected in parallel to said second capacitor.

22. The motor drive of claim 15 wherein said first and second varistors are metal oxide varistors (MOVs).

23. The motor drive of claim 15 wherein said second line is a neutral line.

24. The motor drive of claim 15 wherein said second line is a second live line.

25. A method for insulation testing an electric machine with a surge protection circuit without using a jumper circuit to disconnect said surge protection circuit during said insulation testing, comprising:
    providing an electric machine having a live line, a ground line and a second line;

converting an AC power input to a DC power output via a rectifier that communicates with said live line, said ground line and said second line;

providing a first capacitor between a first output of said rectifier and said second line;

providing a second capacitor between a second output of said rectifier and said second line;

connecting a first varistor and a gas discharge tube (GDT) in series between one of a live line and a second line and said second line and said ground line, thereby operably connecting said GDT to clamp voltage by diverting excess voltage from one of said live line and said second line to said ground line;

setting a trigger voltage of said GDT greater than a hi-pot test voltage, wherein said GDT is conductive above said trigger voltage and non-conductive below said trigger voltage; and performing said insulating testing.

26. The method of claim 25 further comprising setting a voltage threshold of said first varistor less than a hi-pot test voltage and said trigger voltage, said hi-pot test voltage less than said trigger voltage, and said trigger voltage is less than a surge voltage.

27. The method of claim 26 wherein said surge protector further comprises a second varistor connected between the other of said live line and said second line and said second line and said ground line.

28. The method of claim 27 further comprising clamping excess voltage between said live line and said second line and between said second line and said ground line when a voltage on said live line exceeds said trigger voltage using said first varistor, said second varistor and said GDT.

29. The method of claim 25 wherein performing said insulating testing comprises applying a voltage signal to said live line.

30. The method of claim 29 wherein said applied voltage signal is applied for a test time.

31. The method of claim 25 wherein said test time is one second.

32. The method of claim 29 wherein said applied voltage signal includes a voltage greater than or equal to 1230V and less than or equal to 1800V.

* * * * *

UNITED STATES PATENT AND TRADEMARK OFFICE
CERTIFICATE OF CORRECTION

PATENT NO. : 7,312,970 B2
APPLICATION NO. : 10/754739
DATED : April 30, 2008
INVENTOR(S) : James L. Skinner It is certified that error appears in the above-identified patent and that said Letters Patent is hereby corrected as shown below:

Column 4,
Line 22, "1 s" should be --1s--.

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,312,970 B2 | Page 1 of 1 |
| APPLICATION NO. | : 10/754739 | |
| DATED | : December 25, 2007 | |
| INVENTOR(S) | : James L. Skinner | |

It is certified that error appears in the above-identified patent and that said Letters Patent is hereby corrected as shown below:

Column 4,
Line 22, "1 s" should be --1s--.

This certificate supersedes the Certificate of Correction issued July 29, 2008.

Signed and Sealed this

Twenty-sixth Day of August, 2008

JON W. DUDAS
*Director of the United States Patent and Trademark Office*